(12) United States Patent
Ishida

(10) Patent No.: US 12,221,689 B2
(45) Date of Patent: Feb. 11, 2025

(54) INSULATING STRUCTURE, METHOD FOR MANUFACTURING INSULATING STRUCTURE, ION GENERATION DEVICE, AND ION IMPLANTER

(71) Applicant: SUMITOMO HEAVY INDUSTRIES ION TECHNOLOGY CO., LTD., Tokyo (JP)

(72) Inventor: Yuuji Ishida, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 471 days.

(21) Appl. No.: 17/530,083

(22) Filed: Nov. 18, 2021

(65) Prior Publication Data

US 2022/0154328 A1    May 19, 2022

(30) Foreign Application Priority Data

Nov. 19, 2020  (JP) ................. 2020-192598

(51) Int. Cl.
*H02G 3/22* (2006.01)
*C23C 14/48* (2006.01)
*H01J 37/32* (2006.01)

(52) U.S. Cl.
CPC ........ *C23C 14/48* (2013.01); *H01J 37/32412* (2013.01); *H01J 37/32532* (2013.01); *H01J 2237/038* (2013.01)

(58) Field of Classification Search
CPC .... H02G 3/22; H02G 3/26; H02G 3/24; H01J 2237/038; H01J 2237/032; H01J 2237/03
USPC ........ 174/174, 137 R, 138 R, 142, 155, 156, 174/157, 158 R
See application file for complete search history.

(56) References Cited

U.S. PATENT DOCUMENTS

| | | | |
|---|---|---|---|
| 5,886,355 A | 3/1999 | Bright et al. | |
| 9,281,160 B2 | 3/2016 | Sato | |
| 10,074,508 B2 | 9/2018 | Baggett et al. | |
| 10,497,546 B2* | 12/2019 | Kawaguchi | H01J 37/3171 |
| 10,679,818 B2 | 6/2020 | Baggett et al. | |
| 12,020,896 B2* | 6/2024 | Lin | H01J 37/08 |

FOREIGN PATENT DOCUMENTS

| | | |
|---|---|---|
| JP | H05-182623 A | 7/1993 |
| JP | 2000-331620 A | 11/2000 |
| JP | 2014-235814 A | 12/2014 |
| JP | 2018-533184 A | 11/2018 |
| WO | WO-2017/083516 A1 | 5/2017 |

\* cited by examiner

*Primary Examiner* — Angel R Estrada
(74) *Attorney, Agent, or Firm* — Michael Best & Friedrich LLP

(57) ABSTRACT

There is provided an insulating structure including a first end portion, a second end portion, a shaft portion connecting the first end portion and the second end portion to each other, and a surrounding portion including an inner surface facing an outer surface of the shaft portion and extending toward the second end portion from the first end portion. A gap between the outer surface of the shaft portion and the inner surface of the surrounding portion is configured to communicate with an outside. The first end portion, the second end portion, the shaft portion, and the surrounding portion are formed of electrical insulating material.

11 Claims, 9 Drawing Sheets

INSULATING STRUCTURE, METHOD FOR MANUFACTURING INSULATING STRUCTURE, ION GENERATION DEVICE, AND ION IMPLANTER

RELATED APPLICATIONS

The content of Japanese Patent Application No. 2020-192598, on the basis of which priority benefits are claimed in an accompanying application data sheet, is in its entirety incorporated herein by reference.

BACKGROUND

Technical Field

Certain embodiments of the present invention relate to an insulating structure, a method for manufacturing an insulating structure, an ion generation device, and an ion implanter.

Description of Related Art

In a semiconductor manufacturing process, a process of implanting ions into a semiconductor wafer (also referred to as an ion implantation process) is generally performed in order to change conductivity of a semiconductor, and/or in order to change a crystal structure of the semiconductor. A device used for the ion implantation process is generally called an ion implanter. The ion implanter includes an ion generation device for converting a source gas into a plasma to generate the ions. The ions generated by the ion generation device are extracted through an electric field applied by an extraction electrode. The extraction electrode is supported by an insulating structure (for example, refer to the related art).

SUMMARY

According to an embodiment of the present invention, there is provided an insulating structure including a first end portion, a second end portion, a shaft portion connecting the first end portion and the second end portion to each other, and a surrounding portion including an inner surface facing an outer surface of the shaft portion and extending toward the second end portion from the first end portion. A gap between the outer surface of the shaft portion and the inner surface of the surrounding portion is configured to communicate with an outside. The first end portion, the second end portion, the shaft portion, and the surrounding portion are formed of electrical insulating material.

According to another embodiment of the present invention, there is provided a method for manufacturing an insulating structure, in which the insulating structure includes a first end portion, a second end portion, a shaft portion connecting the first end portion and the second end portion to each other, and a surrounding portion including an inner surface facing an outer surface of the shaft portion and extending toward the second end portion from the first end portion. A gap between the outer surface of the shaft portion and the inner surface of the surrounding portion is configured to communicate with an outside. The method includes forming the first end portion, the second end portion, the shaft portion, and the surrounding portion with electrical insulating material.

According to yet another embodiment of the present invention, there is provided an ion generation device including: an arc chamber including a plasma generation chamber in which a plasma is generated and a front slit; and an extraction electrode system that extracts ions generated in the plasma generation chamber to outside of the arc chamber through the front slit. The extraction electrode system includes: a first extraction electrode provided downstream of the front slit, wherein a suppression voltage is applied to the first extraction electrode to have a negative potential with respect to a ground potential; a second extraction electrode provided downstream of the first extraction electrode, wherein the ground potential is applied to the second extraction electrode; and an insulating structure provided between the first extraction electrode and the second extraction electrode, wherein the insulating structure supports the first extraction electrode and the second extraction electrode and electrically insulates between the first extraction electrode and the second extraction electrode. The insulating structure includes: a first end portion; a second end portion; a shaft portion connecting the first end portion and the second end portion to each other; and a surrounding portion including an inner surface facing an outer surface of the shaft portion, and extending toward the second end portion from the first end portion. A gap between the outer surface of the shaft portion and the inner surface of the surrounding portion is configured to communicate with an outside. The first end portion, the second end portion, the shaft portion, and the surrounding portion are formed of electrical insulating material.

According to yet another embodiment of the present invention, there is provided an ion implanter including an ion generation device, a beamline device that transports an ion beam extracted from the ion generation device, and an implantation process chamber in which a workpiece is implanted with the ion beam output from the beamline device. The ion generation device includes: an arc chamber including a plasma generation chamber in which a plasma is generated and a front slit; and an extraction electrode system that extracts ions generated in the plasma generation chamber to outside of the arc chamber through the front slit. The extraction electrode system includes: a first extraction electrode provided downstream of the front slit, wherein a suppression voltage is applied to the first extraction electrode to have a negative potential with respect to a ground potential; a second extraction electrode provided downstream of the first extraction electrode, wherein the ground potential is applied to the second extraction electrode; and an insulating structure provided between the first extraction electrode and the second extraction electrode, wherein the insulating structure supports the first extraction electrode and the second extraction electrode and electrically insulates between the first extraction electrode and the second extraction electrode. The insulating structure includes: a first end portion; a second end portion; a shaft portion connecting the first end portion and the second end portion to each other; and a surrounding portion including an inner surface facing an outer surface of the shaft portion, and extending toward the second end portion from the first end portion. A gap between the outer surface of the shaft portion and the inner surface of the surrounding portion is configured to communicate with an outside. The first end portion, the second end portion, the shaft portion, and the surrounding portion are formed of electrical insulating material.

DETAILED

Figure 1:
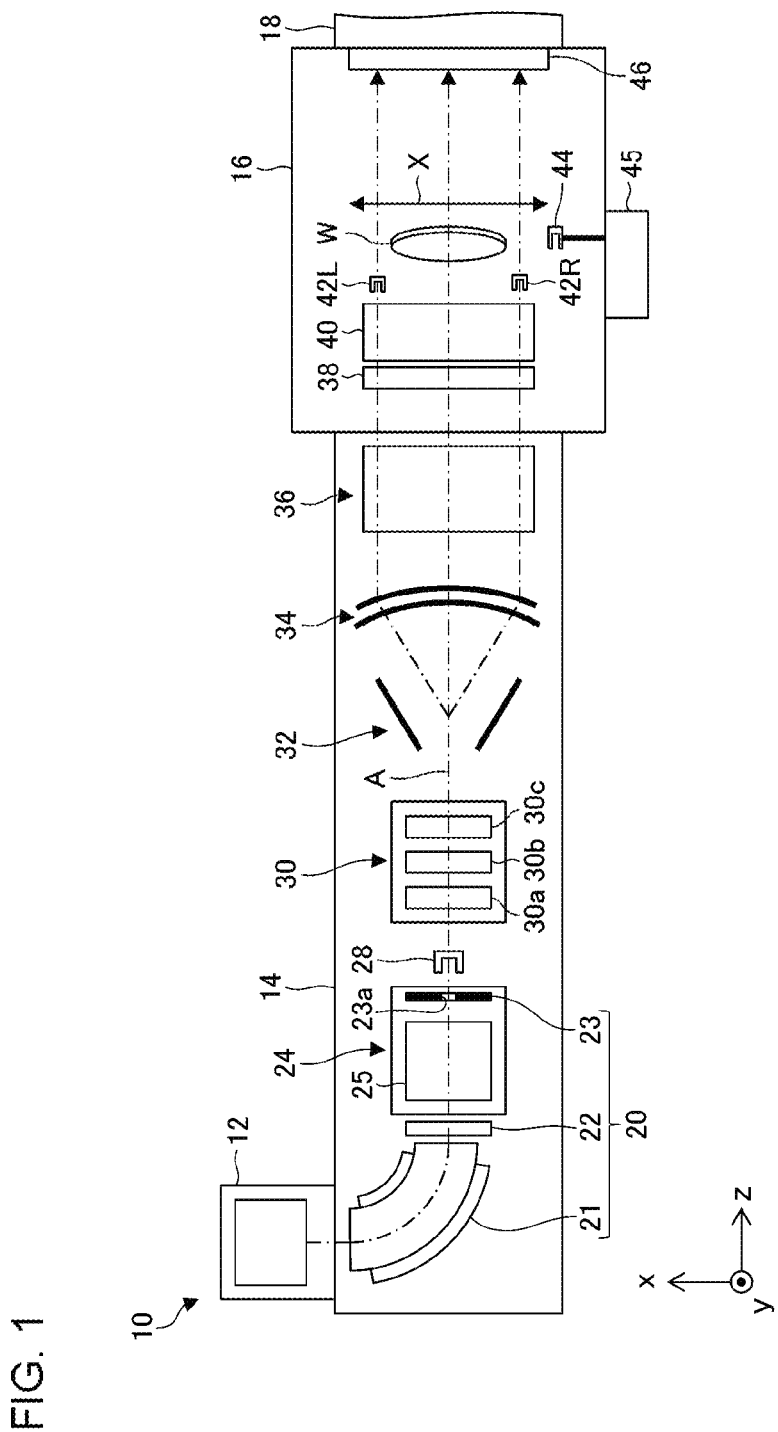
FIG. 1 is a top view illustrating a schematic configuration of an ion implanter according to an embodiment.

Conductive contaminants adhere to a surface of an insulating structure due to operation of the ion implanter. Regular maintenance is required since insulating performance of the insulating structure deteriorates when the contaminants adhere to the surface of the insulating structure. Frequent maintenance of the insulating structure leads to a decrease in productivity of the ion implanter.

It is desirable to provide an insulating structure which can prevent the insulating performance from deteriorating due to adhesion of the contaminants.

According to an embodiment of the present invention, it is possible to provide the insulating structure which can prevent the insulating performance from deteriorating due to adhesion of the contaminants. Any desired combination of the above-described components, and those in which the components or expressions according to the present invention are substituted from each other in methods, devices, or systems are effectively applicable as an aspect of the present invention.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Figure 2:
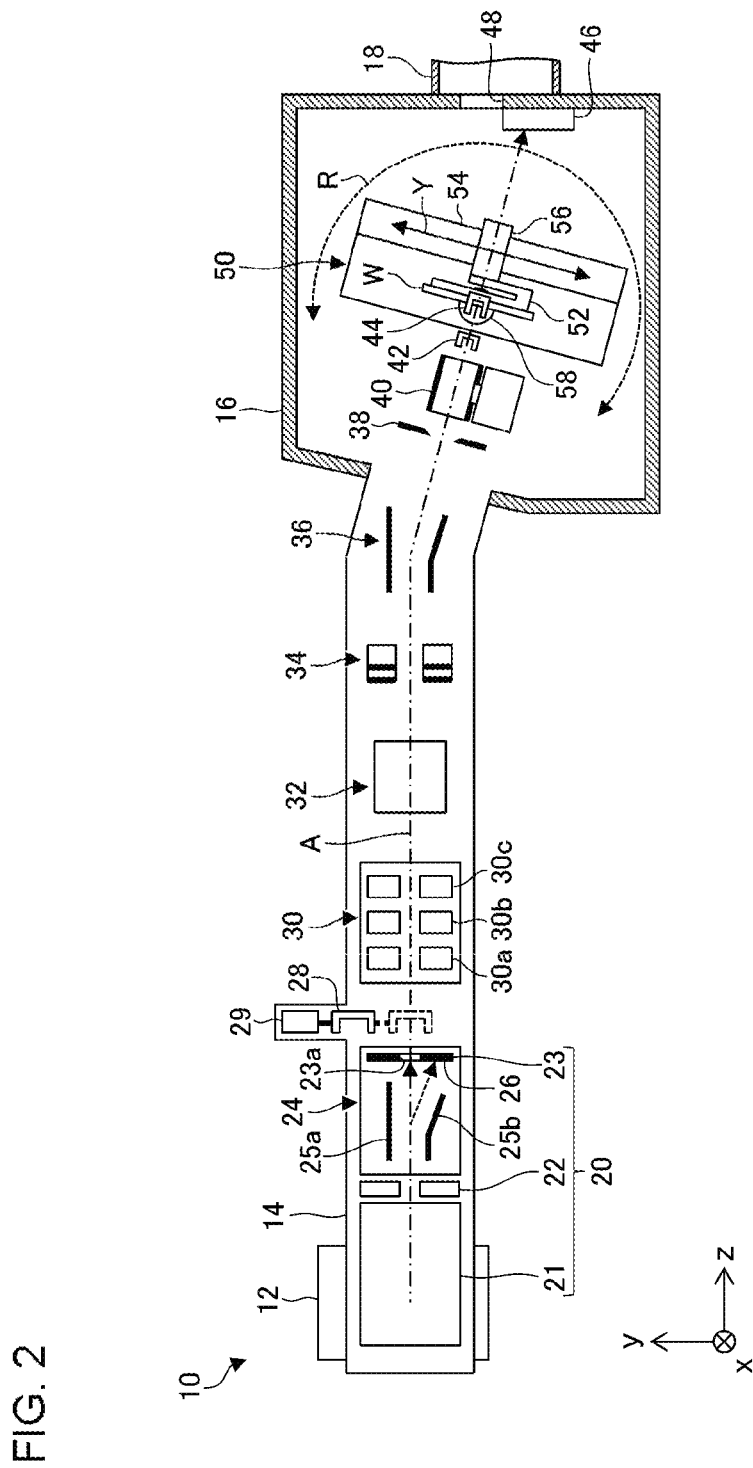
FIG. 2 is a side view illustrating a schematic configuration of the ion implanter in FIG. 1.

FIG. 1 is a top view schematically illustrating an ion implanter 10 according to an embodiment, and FIG. 2 is a side view illustrating a schematic configuration of the ion implanter 10. The ion implanter 10 is configured to perform an ion implantation process into a surface of a workpiece W. For example, the workpiece W is a substrate, or is a semiconductor wafer. For convenience of description, the workpiece W may be referred to as a wafer W in the description herein. However, the description is not intended to limit a target of implantation process to a specific object.

The ion implanter 10 is configured to irradiate a whole processing surface of the wafer W with the ion beam by performing reciprocating scanning using the beam in one direction and causing the wafer W to reciprocate in another direction perpendicular to the scanning direction. In the description herein, for convenience of description, a traveling direction of the ion beam which travels along a designed beamline A is defined as a z-direction, and a plane perpendicular to the z-direction is defined as an xy-plane. When the workpiece W is scanned with the ion beam, a scanning direction of the beam is defined as an x-direction, and a direction perpendicular to the z-direction and the x-direction is defined as a y-direction. Therefore, the reciprocating scanning using the beam is performed in the x-direction, and a reciprocating motion of the wafer W is performed in the y-direction.

The ion implanter 10 includes an ion generation device 12, a beamline unit (a beamline) 14, an implantation process chamber 16, and a wafer transfer device 18. The ion generation device 12 is configured to provide the ion beam for the beamline unit 14. The beamline unit 14 is configured to transport the ion beam from the ion generation device 12 to the implantation process chamber 16. The implantation process chamber 16 accommodates the wafer W which is an implantation target, and performs an implantation process of irradiating the wafer W with the ion beam provided and from the beamline unit 14. The wafer transfer device 18 is configured to load an unprocessed wafer before the implantation process into the implantation process chamber 16, and unload a processed wafer after the implantation process from the implantation process chamber 16. The ion implanter 10 includes a vacuum exhaust system (not illustrated) for providing desired vacuum environments for the ion generation device 12, the beamline unit 14, the implantation process chamber 16, and the wafer transfer device 18.

The beamline unit 14 includes a mass analyzing unit 20, a beam park device 24, a beam shaping unit 30, a beam scanning unit 32, a beam parallelizing unit 34, and an angular energy filter (AEF) 36, sequentially from an upstream side of the beamline A. The upstream side of the beamline A means a side closer to the ion generation device 12, and a downstream side of the beamline A means a side closer to the implantation process chamber 16 (or a beam stopper 46).

The mass analyzing unit 20 is provided downstream of the ion generation device 12, and is configured to select a required ion species from the ion beam extracted from the ion generation device 12 by performing mass analyzing. The mass analyzing unit 20 has a mass analyzing magnet 21, a mass analyzing lens 22, and a mass analyzing slit 23.

The mass analyzing magnet 21 applies a magnetic field to the ion beam extracted from the ion generation device 12, and deflects the ion beam to travel in different paths in accordance with a value of a mass-to-charge ratio $M=m/q$ (m is mass, and q is charge) of the ions. For example, the mass analyzing magnet 21 applies the magnetic field in the y-direction (–y-direction in FIGS. 1 and 2) to the ion beam so that the ion beam is deflected in the x-direction. Magnetic field intensity of the mass analyzing magnet 21 is adjusted so that the ion species having a desired mass-to-charge ratio M passes through the mass analyzing slit 23.

The mass analyzing lens 22 is provided downstream of the mass analyzing magnet 21, and is configured to adjust focusing/defocusing power for the ion beam. The mass analyzing lens 22 adjusts a focusing position of the ion beam passing through the mass analyzing slit 23 in a beam traveling direction (z-direction), and adjusts a mass resolution $M/dM$ of the mass analyzing unit 20. The mass analyzing lens 22 is not an essential configuration, and the mass analyzing unit 20 may not have the mass analyzing lens 22.

The mass analyzing slit 23 is provided downstream of the mass analyzing lens 22, and is provided at a position away from the mass analyzing lens 22. The mass analyzing slit 23 is configured so that a beam deflecting direction (x-direction) by the mass analyzing magnet 21 coincides with a slit width direction, and has an opening 23a having a shape which is relatively short in the x-direction and relatively long in the y-direction.

The mass analyzing slit 23 may be configured so that the slit width is variable for adjusting the mass resolution. The mass analyzing slit 23 may be configured to include two blocking bodies that are movable in the slit width direction, and may be configured so that the slit width is adjustable by changing an interval between the two blocking bodies. The mass analyzing slit 23 may be configured so that the slit width is variable by switching any one of a plurality of slits having different slit widths.

The beam park device 24 is configured to cause the ion beam to temporarily retreat from the beamline A and to block the ion beam directed to the implantation process chamber 16 (or the wafer W) located downstream. The beam park device 24 can be disposed at any desired position in an intermediate portion of the beamline A. For example, the beam park device 24 can be disposed between the mass analyzing lens 22 and the mass analyzing slit 23. A prescribed distance is required between the mass analyzing lens 22 and the mass analyzing slit 23. Accordingly, the beam park device 24 is disposed between both of them. In this manner, a length of the beamline A can be shortened, compared to a case where the beam park device 24 is disposed at another position. Therefore, the whole ion implanter 10 can be reduced in size.

The beam park device 24 includes a pair of park electrodes 25 (25a and 25b) and a beam dump 26. The pair of park electrodes 25a and 25b faces each other across the beamline A, and faces each other in a direction (y-direction) perpendicular to the beam deflecting direction (x-direction) by the mass analyzing magnet 21. The beam dump 26 is provided on the downstream side of the beamline A than the park electrodes 25a and 25b, and is provided away from the beamline A in a facing direction of the park electrodes 25a and 25b.

The first park electrode 25a is disposed on an upper side of the beamline A in a direction of gravity, and the second park electrode 25b is disposed on a lower side of the beamline A in the direction of gravity. The beam dump 26 is provided at a position away to the lower side of the beamline A in the direction of gravity, and is disposed on the lower side of the opening 23a of the mass analyzing slit 23 in the direction of gravity. For example, the beam dump 26 is configured on a portion where the opening 23a of the mass analyzing slit 23 is not formed. The beam dump 26 may be configured to be separate from the mass analyzing slit 23.

The beam park device 24 deflects the ion beam by using an electric field applied between the pair of park electrodes 25a and 25b, and causes the ion beam to retreat from the beamline A. For example, a negative voltage is applied to the second park electrode 25b with an electric potential of the first park electrode 25a as reference. In this manner, the ion beam is deflected downward from the beamline A in the direction of gravity, and is incident into the beam dump 26. In FIG. 2, a trajectory of the ion beam directed toward the beam dump 26 is indicated by a dashed line. The beam park device 24 causes the ion beam to pass toward the downstream side along the beamline A by setting the pair of park electrodes 25a and 25b to have the same electric potential. The beam park device 24 is configured to be operable by switching between a first mode in which the ion beam passes toward the downstream side and a second mode in which the ion beam is incident into the beam dump 26.

An injector Faraday cup 28 is provided downstream of the mass analyzing slit 23. The injector Faraday cup 28 is configured to be movable into and out of the beamline A by an operation of an injector drive unit 29. The injector drive unit 29 moves the injector Faraday cup 28 in a direction (for example, the y-direction) perpendicular to an extending direction of the beamline A. When the injector Faraday cup 28 is disposed on the beamline A as illustrated by a dashed line in FIG. 2, the injector Faraday cup 28 blocks the ion beam directed toward the downstream side. On the other hand, when the injector Faraday cup 28 is removed from the beamline A as illustrated by a solid line in FIG. 2, the blocking of the ion beam directed toward the downstream side is released.

The injector Faraday cup 28 is configured to measure a beam current of the ion beam subjected to mass analyzing by the mass analyzing unit 20. The injector Faraday cup 28 can measure a mass analyzing spectrum of the ion beam by measuring the beam current while changing the magnetic field intensity of the mass analyzing magnet 21. The mass resolution of the mass analyzing unit 20 can be calculated using the measured mass analyzing spectrum.

The beam shaping unit 30 includes a focusing/defocusing device such as a focusing/defocusing quadrupole lens (Q-lens), and is configured to shape the ion beam having passed through the mass analyzing unit 20 into a desired cross-sectional shape. For example, the beam shaping unit 30 is configured as an electric field type three-stage quadrupole lens (also referred to as a triplet Q-lens), and has three quadrupole lenses 30a, 30b, and 30c. The beam shaping unit 30 adopts the three lens devices 30a to 30c. Accordingly, the beam shaping unit 30 can independently adjust convergence or divergence of the ion beam in the x-direction and the y-direction, respectively. The beam shaping unit 30 may include a magnetic field type lens device, or may include a lens device that shapes the beam by using both an electric field and a magnetic field.

The beam scanning unit 32 is a beam deflection device configured to provide reciprocating scanning using the beam and to perform scanning using the shaped ion beam in the x-direction. The beam scanning unit 32 has a scanning electrode pair facing in a beam scanning direction (x-direction). The scanning electrode pair is connected to variable voltage power supplies (not illustrated), and a voltage applied between the scanning electrode pair is periodically changed. In this manner, an electric field generated between the electrodes is changed so that the ion beam is deflected at various angles. As a result, a whole scanning range is scanned with the ion beam in the x-direction. In FIG. 1, the scanning direction and the scanning range of the ion beam are indicated by an arrow X, and a plurality of trajectories of the ion beam in the scanning range are indicated by one dot chain lines.

The beam parallelizing unit 34 is configured so that the traveling directions of the ion beam used for the scanning become parallel to the trajectory of the designed beamline A. The beam parallelizing unit 34 has a plurality of arc-shaped parallelizing lens electrodes in each of which an ion beam passing slit is provided in a central portion in the y-direction. The parallelizing lens electrodes are connected to high-voltage power supplies (not illustrated), and apply an electric field generated by voltage application to the ion beam so that the traveling directions of the ion beam are parallelized. The beam parallelizing unit 34 may be replaced with another beam parallelizing device, and the another beam parallelizing device may be configured to serve as a magnet device using a magnetic field.

An acceleration/deceleration (AD) column (not illustrated) for accelerating or decelerating the ion beam may be provided downstream of the beam parallelizing unit 34.

The angular energy filter (AEF) 36 is configured to analyze energy of the ion beam, to deflect ions having necessary energy downward at a prescribed angle, and to guide the ions to the implantation process chamber 16. The angular energy filter 36 has an AEF electrode pair for deflection by an electric field. The AEF electrode pair is connected to high-voltage power supplies (not illustrated). In FIG. 2, the ion beam is deflected downward by applying a positive voltage to the upper AEF electrode and applying a negative voltage to the lower AEF electrode. The angular energy filter 36 may be configured to include a magnet device for deflection by a magnetic field, or may be configured to include a combination between the AEF electrode pair for deflection by an electric field and the magnet device for deflection by a magnetic field.

In this way, the beamline unit 14 supplies the ion beam to be used for irradiating the wafer W to the implantation process chamber 16.

The implantation process chamber 16 includes an energy slit 38, a plasma shower device 40, side cups 42, a center cup 44, and the beam stopper 46, sequentially from the upstream side of the beamline A. As illustrated in FIG. 2, the implantation process chamber 16 includes a platen driving device 50 that holds one or more wafers W.

The energy slit 38 is provided downstream of the angular energy filter 36, and analyzes the energy of the ion beam incident into the wafer W together with the angular energy filter 36. The energy slit 38 is an energy defining slit (EDS) configured as a slit that is horizontally long in the beam scanning direction (x-direction). The energy slit 38 causes the ion beam having a desired energy value or a desired energy range to pass toward the wafer W, and blocks the other ion beams.

The plasma shower device 40 is located downstream of the energy slit 38. The plasma shower device 40 supplies low-energy electrons to the ion beam and a surface of the wafer W (wafer processing surface) in accordance with a beam current of the ion beam, and prevents charge-up caused by accumulation of positive charges on the wafer processing surface due to ion implantation. For example, the plasma shower device 40 includes a shower tube through which the ion beam passes, and a plasma generating device that supplies electrons into the shower tube.

The side cups 42 (42R and 42L) are configured to measure the beam current of the ion beam during the ion implantation process into the wafer W. As illustrated in FIG. 2, the side cups 42R and 42L are disposed to be shifted to the right and left (x-direction) with respect to the wafer W disposed on the beamline A, and are disposed at positions at which the side cups 42R and 42L do not block the ion beam directed toward the wafer W during the ion implantation. The ion beam is subject to scanning in the x-direction beyond a range where the wafer W is located. Accordingly, a portion of the beam for the scanning is incident into the side cups 42R and 42L even during the ion implantation. In this manner, the beam current during the ion implantation process is measured by the side cups 42R and 42L.

The center cup 44 is configured to measure the beam current on the wafer processing surface. The center cup 44 is configured to be movable in the x-direction by an operation of a drive unit 45, is retreated from an implantation position where the wafer W is located during the ion implantation, and is inserted into the implantation position when the wafer W is not located at the implantation position. The center cup 44 measures the beam current while moving in the x-direction. In this manner, the center cup 44 can measure the beam current over the whole beam scanning range in the x-direction. The center cup 44 may be formed in an array shape in which a plurality of Faraday cups are aligned in the x-direction so that the beam currents can be simultaneously measured at a plurality of positions in the beam scanning direction (x-direction).

At least one of the side cups 42 and the center cup 44 may include a single Faraday cup for measuring the beam current, or may include an angle measurement device for measuring angle information of the beam. For example, the angle measurement device includes a slit and a plurality of current detectors provided away from the slit in the beam traveling direction (z-direction). For example, the angle measurement device can measure an angle component of the beam in the slit width direction by causing the plurality of current detectors aligned in the slit width direction to measure the beams having passed through the slit. At least one of the side cups 42 and the center cup 44 may include a first angle measurement device capable of measuring angle information in the x-direction, or a second angle measurement device capable of measuring angle information in the y-direction.

The platen driving device 50 includes a wafer holding device 52, a reciprocating mechanism 54, a twist angle adjusting mechanism 56, and a tilt angle adjusting mechanism 58. The wafer holding device 52 includes an electrostatic chuck or the like for holding the wafer W. The reciprocating mechanism 54 causes the wafer holding device 52 to reciprocate in a reciprocating direction (y-direction) perpendicular to the beam scanning direction (x-direction). In this manner, the wafer held by the wafer holding device 52 is caused to reciprocate in the reciprocating direction (y-direction). In FIG. 2, a reciprocating motion of the wafer W is indicated by an arrow Y.

The twist angle adjusting mechanism 56 adjusts a rotation angle of the wafer W. The twist angle adjusting mechanism 56 rotates the wafer W around a normal line of the wafer processing surface as an axis. In this manner, the twist angle adjusting mechanism 56 adjusts a twist angle between an alignment mark provided on an outer peripheral portion of the wafer and a reference position. Here, the alignment mark of the wafer means a notch or an orientation flat provided on the outer peripheral portion of the wafer, and means a mark that serves as a reference for an angular position in a crystal axis direction of the wafer or in a circumferential direction of the wafer. The twist angle adjusting mechanism 56 is provided between the wafer holding device 52 and the reciprocating mechanism 54, and is caused to reciprocate together with the wafer holding device 52.

The tilt angle adjusting mechanism 58 adjusts tilting of the wafer W, and adjusts a tilt angle between the traveling direction of the ion beam directed toward the wafer processing surface and the normal line of the wafer processing surface. In the present embodiment, out of tilt angles of the wafer W, an angle at which an axis in the x-direction is a rotation center axis is adjusted as the tilt angle. The tilt angle adjusting mechanism 58 is provided between the reciprocating mechanism 54 and an inner wall of the implantation process chamber 16, and rotates the whole platen driving device 50 including the reciprocating mechanism 54 in an R-direction. In this manner, the tilt angle adjusting mechanism 58 is configured to adjust the tilt angle of the wafer W.

The platen driving device 50 holds the wafer W so that the wafer W is movable between the implantation position where the wafer W is irradiated with the ion beam and a transfer position where the wafer W is loaded or unloaded between the platen driving device 50 and the wafer transfer device 18. FIG. 2 illustrates a state where the wafer W is located at the implantation position, and the platen driving device 50 holds the wafer W so that the beamline A and the wafer W intersect with each other. The transfer position of the wafer W corresponds to a position of the wafer holding device 52 when the wafer W is loaded or unloaded through a transfer port 48 by a transfer mechanism or a transfer robot provided in the wafer transfer device 18.

The beam stopper 46 is provided on the most downstream side of the beamline A, and is mounted on the inner wall of the implantation process chamber 16, for example. When the wafer W does not exist on the beamline A, the ion beam is incident into the beam stopper 46. The beam stopper 46 is located close to the transfer port 48 that connects the implantation process chamber 16 and the wafer transfer device 18 to each other, and is provided at a position vertically below the transfer port 48.

Figure 3:
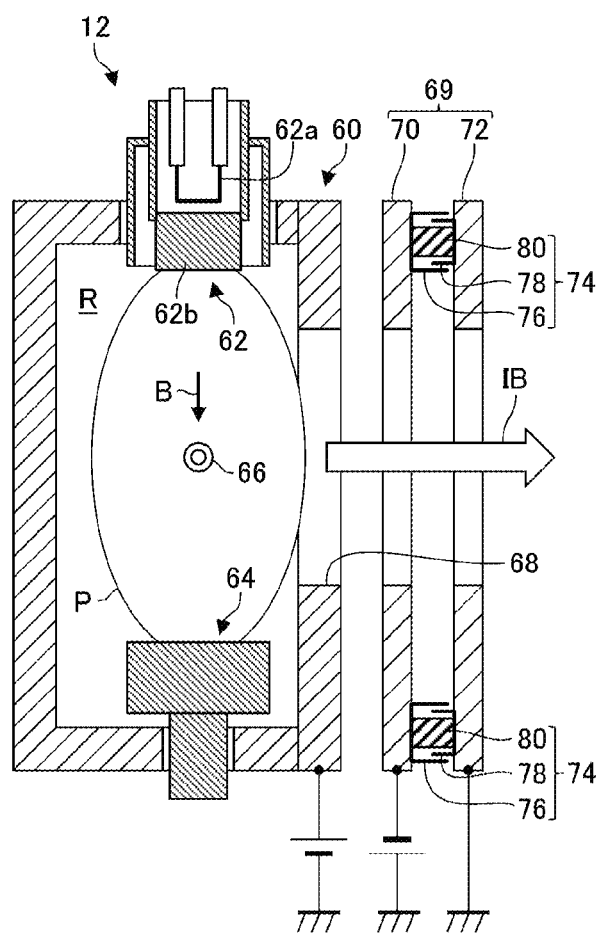
FIG. 3 is a view schematically illustrating a configuration of an ion generation device according to the embodiment.

FIG. 3 is a sectional view schematically illustrating a configuration of the ion generation device 12 according to the embodiment. The ion generation device 12 includes an arc chamber 60, a cathode 62, a repeller 64, and a extraction electrode system. The extraction electrode system 69 incudes a first extraction electrode 70, a second extraction electrode 72, and an insulating structure 74.

The arc chamber 60 has a substantially rectangular parallelepiped box shape. The arc chamber 60 defines a plasma generation chamber R in which the plasma P is generated. The arc chamber 60 is formed of a refractory material, and for example, is formed of refractory metal such as tungsten (W), molybdenum (Mo), and tantalum (Ta), an alloy thereof, or graphite (C). In this manner, it is possible to prevent damage caused by the heat of the arc chamber 60 in an environment where the inside of the plasma generation chamber R has a high temperature (for example, 700° C. to 2000° C.).

The cathode 62 emits thermal electrons into the plasma generation chamber R. The cathode 62 is a so-called indirectly heated cathode (IHC), and has a filament 62*a* and a cathode head 62*b*. The filament 62*a* is heated by a filament power supply to generate primary thermal electrons. The primary thermal electrons generated by the filament 62*a* are accelerated by a cathode voltage applied between the filament 62*a* and the cathode head 62*b*. The cathode head 62*b* is heated by the accelerated primary thermal electrons from the filament 62*a*, and supplies secondary thermal electrons into the plasma generation chamber R. The secondary thermal electrons generated by the cathode head 62*b* are accelerated by an arc voltage applied between the arc chamber 60 and the cathode 62.

The repeller 64 is provided at a position facing the cathode 62. The repeller 64 repels the secondary thermal electrons supplied into the plasma generation chamber R and electrons generated by ionization of source gas molecules inside the plasma generation chamber R, and retains both of the electrons inside the plasma generation chamber R so that generation efficiency of plasma is improved.

A gas introduction port 66 is provided through a side wall of the arc chamber 60. The gas introduction port 66 supplies the source gas into the plasma generation chamber R from a gas cylinder or the like (not illustrated). As the source gas, noble gas, hydrides such as hydrogen ($H_2$), phosphine ($PH_3$), and arsine ($AsH_3$), or fluorides such as boron trifluoride ($BF_3$) and germanium tetrafluoride ($GeF_4$) is used. In addition, as the source gas, material containing oxygen atoms (O) such as carbon dioxide ($CO_2$), carbon monoxide (CO), and oxygen ($O_2$) is also used.

A magnetic field B is applied to the plasma generation chamber R in a direction (or a direction opposite thereto) from the cathode 62 toward the repeller 64. The magnetic field B is generated by an electromagnet (not illustrated), and intensity of the magnetic field B is adjusted by changing a magnet current flowing in the electromagnet. The electrons moving inside the plasma generation chamber R are restrained by the magnetic field B applied to the plasma generation chamber R, and spirally moves along the magnetic field B. The electrons spirally moving in the plasma generation chamber R collide with the source gas molecules introduced into the plasma generation chamber R, ionize the source gas molecules to generate the ions and new electrons, and generate the plasma P in the plasma generation chamber R. By causing the electrons to move spirally in the plasma generation chamber R, the generation efficiency of the plasma can be improved.

A front slit 68 for extracting the ion beam IB is provided on a front surface of the arc chamber 60. The front slit 68 has an elongated shape extending in a direction from the cathode 62 toward the repeller 64. The ions generated inside the plasma generation chamber R are extracted as the ion beam IB through the front slit 68 by the extraction electrode system 69 which includes first extraction electrode 70, the second extraction electrode 72, and the insulating structure 74.

The first extraction electrode 70 is provided downstream of the front slit 68. The first extraction electrode 70 is a suppression electrode, and a suppression voltage is applied to the first extraction electrode 70 to have a negative potential with respect to a ground potential. The second extraction electrode 72 is provided downstream of the first extraction electrode 70. The second extraction electrode 72 is a ground electrode, and is connected to the ground potential. An extraction voltage is applied to the arc chamber 60 to have a positive potential with respect to the ground potential. The insulating structure 74 is provided between the first extraction electrode 70 and the second extraction electrode 72. The insulating structure 74 mechanically supports the first extraction electrode 70 and the second extraction electrode 72, and electrically insulates between the first extraction electrode 70 and the second extraction electrode 72.

The insulating structure 74 includes a first cover 76, a second cover 78, and an insulator 80. The first cover 76 and the second cover 78 are formed of conductive material, and are formed of metal or graphite. The insulator 80 is formed of electrically insulating material, and is formed of ceramic or resin. The first cover 76 is provided between the first extraction electrode 70 and the insulator 80. The second cover 78 is provided between the second extraction electrode 72 and the insulator 80.

The first cover 76 and the second cover 78 are provided outside the insulator 80, and prevents contaminants from adhering to a surface of the insulator 80. The first cover 76 and the second cover 78 have a nested structure. In the illustrated example, the first cover 76 is disposed on the outside of the second cover 78, and the second cover 78 is disposed on the inside of the first cover 76. The first cover 76 may be disposed on the inside of the second cover 78, and the second cover 78 may be disposed on the outside of the first cover 76.

Figure 4:
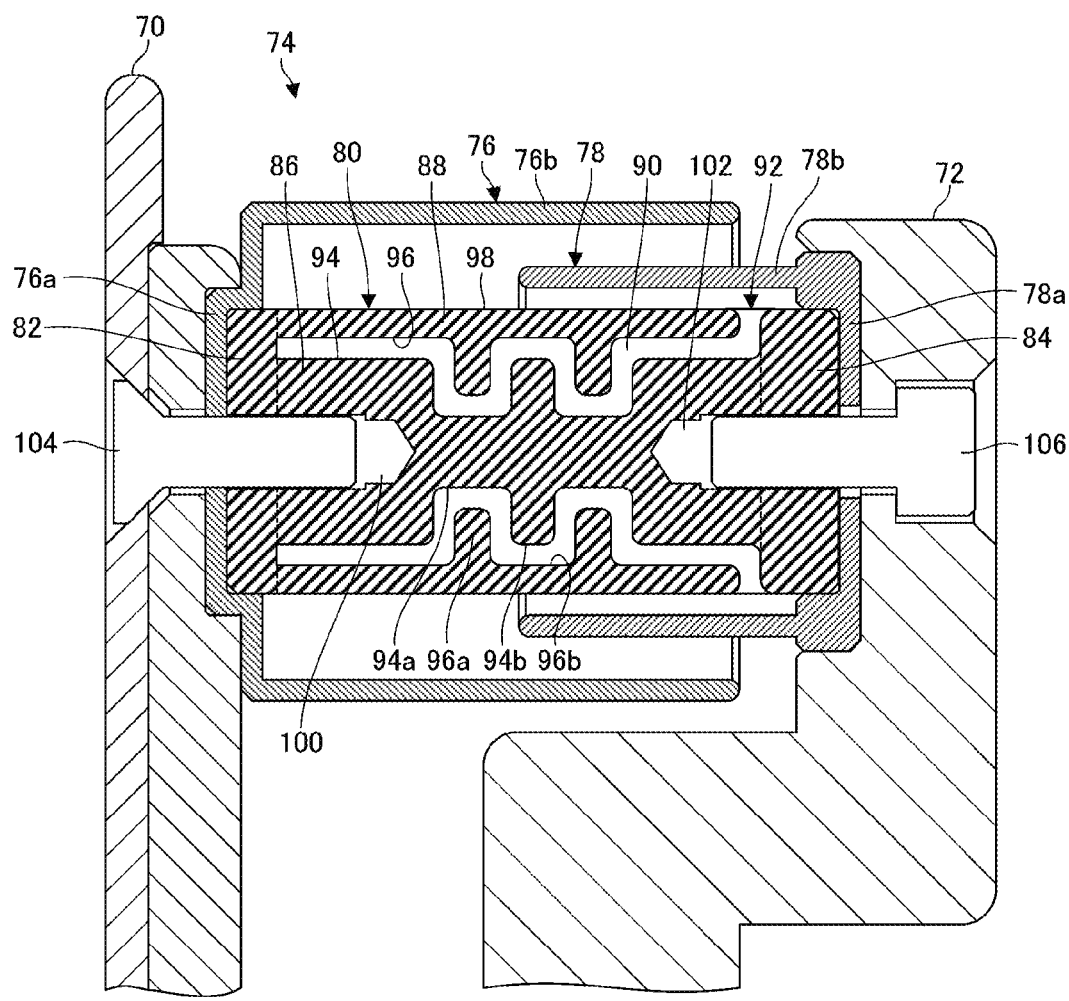
FIG. 4 is a sectional view illustrating a detailed configuration of an insulating structure according to the embodiment.

FIG. 4 is a sectional view illustrating a detailed configuration of the insulating structure 74 according to the embodiment. The insulating structure 74 is provided between the first extraction electrode 70 and the second extraction electrode 72. The insulating structure 74 includes a first cover 76, a second cover 78, and an insulator 80. The insulating structure 74 is fixed to the first extraction electrode 70 by a first screw 104, and is fixed to the second extraction electrode 72 by a second screw 106.

In describing the insulating structure 74, a direction from the first extraction electrode 70 to the second extraction electrode 72 will be referred to as an axial direction. A direction perpendicular to the axial direction, for example, a direction perpendicular to an outer surface 98 of the insulator 80 will be referred to as a radial direction. In addition, a direction perpendicular to both the axial direction and the radial direction, that is, a direction around the axial direction will be referred to as a circumferential direction.

The first cover 76 has a first bottom portion 76a and a first side wall portion 76b, and is configured to have a cup shape. The first bottom portion 76a is a portion pinched between the first extraction electrode 70 and the insulator 80. The first bottom portion 76a is provided with a through-hole through which the first screw 104 is inserted. The first side wall portion 76b is a portion extending in the axial direction from an outer periphery of the first bottom portion 76a, and is formed in a cylindrical shape. An inner diameter of the first side wall portion 76b is larger than an outer diameter of the second cover 78. The first side wall portion 76b is disposed away from the second cover 78 in the radial direction. A length in the axial direction of the first side wall portion 76b is approximately 50% to 80% of a length in the axial direction of the insulator 80. An opening end of the first side wall portion 76b is away from the second extraction electrode 72 in the axial direction.

The second cover 78 has a second bottom portion 78a and a second side wall portion 78b, and is configured to have a cup shape. The second bottom portion 78a is a portion pinched between the second extraction electrode 72 and the insulator 80. The second bottom portion 78a is provided with a through-hole through which the second screw 106 is inserted. The second side wall portion 78b is a portion extending in the axial direction from an outer periphery of the second bottom portion 78a, and is formed in a cylindrical shape. An inner diameter of the second side wall portion 78b is larger than an outer diameter of the insulator 80. The second side wall portion 78b is disposed away from the insulator 80 in the radial direction. The length in the axial direction of the second side wall portion 78b is approximately 30% to 60% of the length in the axial direction of the insulator 80. The second side wall portion 78b is configured so that a range thereof in the axial direction overlaps that of the first side wall portion 76b. The opening end of the second side wall portion 78b is away from the first bottom portion 76a in the axial direction.

The insulator 80 includes a first end portion 82, a second end portion 84, a shaft portion 86, and a surrounding portion 88. The first end portion 82 is a portion connected to the first extraction electrode 70 and the first cover 76 by the first screw 104. A first attachment hole 100 into which the first screw 104 is inserted is provided in a center of the first end portion 82. The second end portion 84 is a portion connected to the second extraction electrode 72 and the second cover 78 by the second screw 106. A second attachment hole 102 into which the second screw 106 is inserted is provided in a center of the second end portion 84.

The shaft portion 86 is a portion that connects the first end portion 82 and the second end portion 84 to each other, and extends in the axial direction from the first end portion 82 toward the second end portion 84. The shaft portion 86 is provided inside the surrounding portion 88. The shaft portion 86 is a columnar member, and has a rotationally symmetric shape. A diameter of the shaft portion 86 is smaller than a diameter of the first end portion 82 and the second end portion 84. The diameter of the shaft portion 86 is changed depending on a position in the axial direction. An outer surface 94 of the shaft portion 86 is provided with an inner recessed portion 94a and an inner protruded portion 94b. The inner recessed portion 94a and the inner protruded portion 94b continuously extend in the circumferential direction.

The surrounding portion 88 is provided outside the shaft portion 86. The surrounding portion 88 extends in the axial direction from the first end portion 82 toward the second end portion 84. The surrounding portion 88 is a tubular member, and has a rotationally symmetric shape. The surrounding portion 88 is connected to the first end portion 82, and is away from the second end portion 84. An opening 92 is formed between the surrounding portion 88 and the second end portion 84. The opening 92 extends in the radial direction. The opening 92 is provided in the vicinity of the second end portion 84. The opening 92 is configured so that an opening width increases as the opening 92 gets away from the shaft portion 86 in the radial direction, and is formed in a tapered shape, for example. The opening 92 is covered by the second cover 78.

The surrounding portion 88 has an inner surface 96 and an outer surface 98. The inner surface 96 of the surrounding portion 88 faces the outer surface 94 of the shaft portion 86. A gap 90 is formed between the inner surface 96 of the surrounding portion 88 and the outer surface 94 of the shaft portion 86. The gap 90 communicates with the outside of the insulator 80 through the opening 92. The outer surface 98 of the surrounding portion 88 is a cylindrical surface, and is configured to be a smooth surface having substantially no unevenness. The outer surface 98 of the surrounding portion 88 faces the first side wall portion 76b of the first cover 76 and the second side wall portion 78b of the second cover 78 in the radial direction.

An inner diameter of the surrounding portion 88 is changed depending on a position in the axial direction. The inner surface 96 of the surrounding portion 88 is provided with an outer protruded portion 96a and an outer recessed portion 96b. The outer protruded portion 96a and the outer recessed portion 96b continuously extend in the circumferential direction. The outer protruded portion 96a is provided at a position corresponding to the inner recessed portion 94a, and the outer recessed portion 96b is provided at a position corresponding to the inner protruded portion 94b. The shaft portion 86 and the surrounding portion 88 are configured so that a distance (that is, a width of the gap 90) between the outer surface 94 of the shaft portion 86 and the inner surface 96 of the surrounding portion 88 is substantially constant. The distance between the outer surface 94 of the shaft portion 86 and the inner surface 96 of the surrounding portion 88 may not be constant, and for example, the width of the gap 90 may decrease as the gap 90 gets away from the opening 92.

The gap 90 formed inside the insulator 80 has an intricate labyrinth structure, and is configured to have a portion which is not directly visible from the outside of the insulator 80. The gap 90 does not linearly extend in the axial direction, and extends to be bent inward in the radial direction and outward in the radial direction. Here, the portion which is not directly visible from the outside of the insulator 80 means a portion which cannot be viewed since a line of sight is blocked by the shaft portion 86 or the surrounding portion 88, when a deep portion of the gap 90 needs to be viewed from the opening 92. The portion which is not directly visible from the outside corresponds to a point where a straight line and at least one of the shaft portion 86 and the surrounding portion 88 overlap each other, when the straight line is drawn to connect any point of the gap 90 and the opening 92 to each other.

Figure 5:
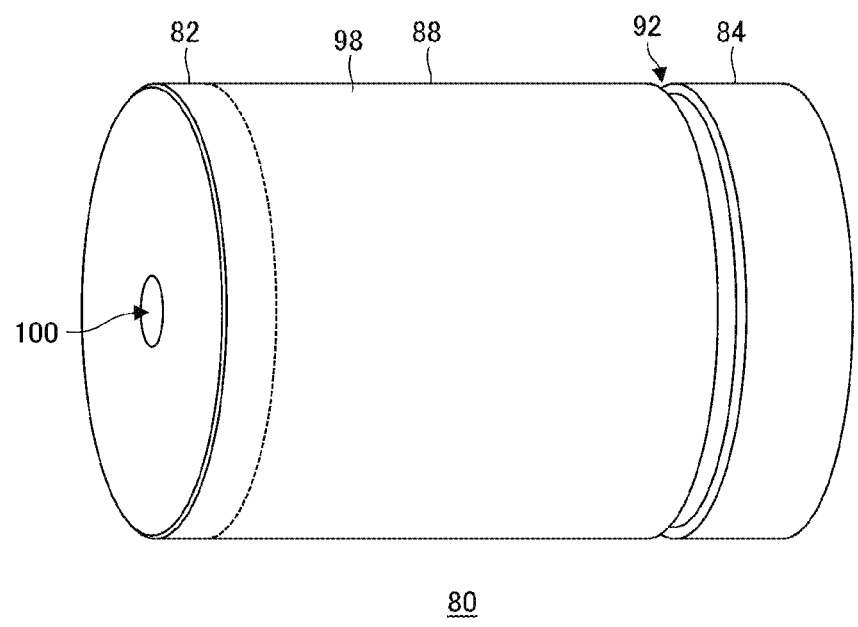
FIG. 5 is a perspective view illustrating an appearance of an insulator illustrated in FIG. 4.

FIG. 5 is a perspective view illustrating an appearance of the insulator 80 illustrated in FIG. 4. As illustrated, the insulator 80 has a columnar shape as a whole. The outer surface 98 of the surrounding portion 88 is formed to have a cylindrical surface. The opening 92 is formed between the surrounding portion 88 and the second end portion 84. The opening 92 is continuously formed in the circumferential direction. Therefore, the surrounding portion 88 is away from the second end portion 84 over the entire circumference. An opening width in the axial direction of the opening 92 is preferably constant over the entire circumference.

According to the insulating structure 74 in the present embodiment, the opening 92 is provided between the first end portion 82 and the second end portion 84. Accordingly, even when conductive contaminants adhere to the outer surface 98 of the insulator 80, the opening 92 can ensure electrical insulation between the first end portion 82 and the second end portion 84. In addition, the gap 90 is provided in a deep portion of the opening 92. Accordingly, unless the conductive contaminants adhere to a whole surface around the gap 90, the electrical insulation between the first end portion 82 and the second end portion 84 can be ensured. The gap 90 has the intricate labyrinth structure. Accordingly, the contaminants entering the gap 90 through the opening 92 are less likely to reach the deep portion of the gap 90. As a result, insulating performance of the insulator 80 can be prevented from deteriorating, and maintenance such as cleaning and replacement of the insulating structure 74 can be less frequently needed.

Next, a method for manufacturing the insulator 80 will be described. For the insulator 80, the whole insulator 80 is formed of electrical insulating material. That is, the first end portion 82, the second end portion 84, the shaft portion 86, and the surrounding portion 88 are formed of the electrical insulating material. In a certain embodiment, the first end portion 82, the second end portion 84, the shaft portion 86, and the surrounding portion 88 are formed of the same material. For example, the insulator 80 is formed of ceramic material such as aluminum oxide ($Al_2O_3$), silicon oxide ($SiO_2$), magnesium oxide (MgO), aluminum nitride (AlN), and boron nitride (BN). The insulator 80 may be formed of oxide-based ceramic material, or may be formed of a simple substance or a mixture of aluminum oxide, silicon oxide, and magnesium oxide. The insulator 80 may be formed of engineering plastic such as epoxy and polyimide.

The insulator 80 has the gap 90 having the intricate labyrinth structure. Accordingly, it is difficult to integrally form the insulator 80 by using a general processing method such as machining. When the insulator 80 is integrally formed, a so-called three-dimensional printing technique such as a laminate shaping method can be used. For example, the gap 90 having the intricate labyrinth structure can be integrally formed by performing laminate shaping for the shaft portion 86 and the surrounding portion 88 from the first end portion 82 to the second end portion 84.

Figure 6:
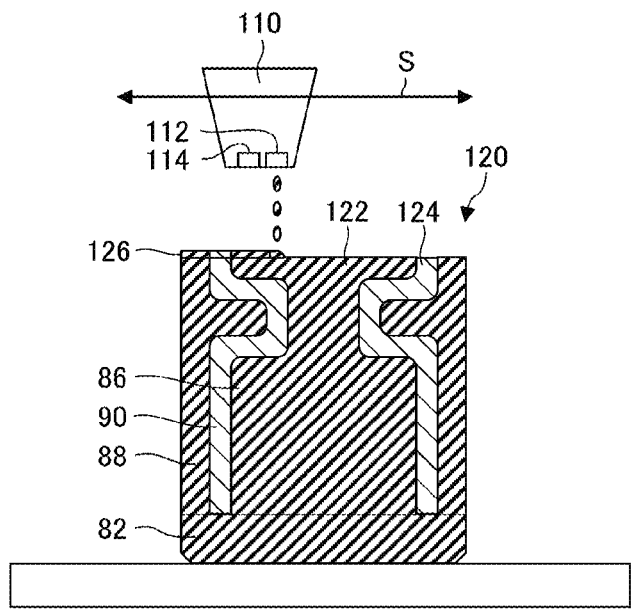
FIG. 6 is a view schematically illustrating a process of forming an intermediate body by a laminate shaping method.

FIG. 6 is a view schematically illustrating a process of forming an intermediate body 120 by the laminate shaping method. The intermediate body 120 includes a main body member 122 and a support member 124. The main body member 122 is a portion serving as the insulator 80, and has a shape corresponding to at least a portion of the first end portion 82, the second end portion 84, the shaft portion 86, and the surrounding portion 88. The support member 124 is a portion that mechanically supports the main body member 122, and is disposed to fill the gap 90 of the insulator 80. The support member 124 may be disposed outside the main body member 122.

The intermediate body 120 is formed by scanning a shaping head 110 by which the main body member 122 and the support member 124 are laminated, as indicated by an arrow S. The shaping head 110 has a first head 112 for laminating the main body member 122 and a second head 114 for laminating the support member 124. A shaping layer 126 is formed by ejecting first material forming the main body member 122 from the first head 112 and ejecting second material forming the support member 124 from the second head 114. The intermediate body 120 is formed by laminating a plurality of the shaping layers 126.

In the illustrated example, the shaping head 110 has the first head 112 and the second head 114, and the first head 112 and the second head 114 are configured to be integrally driven. The first head 112 and the second head 114 may be separately provided, and the first head 112 and the second head 114 may be configured to be independently driven.

The first material includes material constituting the insulator 80. When the insulator 80 is formed of ceramic material, the first material contains ceramic fine particles. The first material is preferably liquid substance that can be ejected from the first head 112, and may contain liquid such as water or resin. When the first material contains the water, the first material may be dried and cured by heating the intermediate body 120 while laminating the first material. The first material may contain an ultraviolet curable resin, and may be cured by irradiating the first material ejected from the first head 112 with ultraviolet light. When the insulator 80 is formed of the resin, the first material may be resin material. The first material may be an ultraviolet curable resin or a thermosetting resin.

The support member 124 is formed of the second material different from the first material. The second material is formed of material selectively removable while leaving the first material after the intermediate body 120 is formed. The second material is formed of resin material that can be melted, evaporated, or pyrolyzed by heating, or resin material that can be dissolved by using a solvent. For example, the second material is thermoplastic resin, and the second material can be laminated by ejecting the second material softened by heating from the second head 114.

When the first material contains the ceramic fine particles, the main body member 122 may be cured by heating the intermediate body 120. In a process of heating the intermediate body 120, the support member 124 may be removed by melting, evaporation, or thermal decomposition. In the process of heating the intermediate body 120, the support member 124 may be completely removed, or may be partially removed. When the support member 124 is partially remained, the partially remained support member 124 may be removed by using a solvent. The support member 124 may be removed by machining. After the support member 124 is removed, the main body member 122 may be heated again. In a first heating process before the support member 124 is removed, the main body member 122 may be dried, and in a second heating process after the support member 124 is removed, the main body member 122 may be fired or sintered. The second heating process may be performed at a higher temperature than the first heating process. By sintering the main body member 122, the insulator 80 formed of ceramic material having excellent electrical insulating properties can be manufactured.

When the first material contains the ultraviolet curable resin, the intermediate body 120 may not be heated. The support member 124 included in the intermediate body 120 may be removed by using the solvent, or may be removed by machining. When the first material contains the thermosetting resin, the main body member 122 may be cured by heating the intermediate body 120. In the process of heating the intermediate body 120, the support member 124 may be completely or partially removed by melting, evaporation, or thermal decomposition. The support member 124 may be removed by using the solvent, or may be removed by machining.

The first attachment hole 100 and the second attachment hole 102 which are provided in the insulator 80 can be formed at any desired timing in a process of manufacturing the insulator 80. The first attachment hole 100 and the second attachment hole 102 may be formed in a process of performing laminate shaping for the intermediate body 120. In this case, the first attachment hole 100 and the second attachment hole 102 may be filled with the support member 124. The first attachment hole 100 and the second attachment hole 102 may be formed by machining the main body member 122 after the laminate shaping for the main body member 122. When the main body member 122 contains the ceramic material, the first attachment hole 100 and the second attachment hole 102 may be formed before the main body member 122 is sintered, or may be formed after the main body member 122 is sintered.

The intermediate body 120 may be formed by a method different from that of the process illustrated in FIG. 6. For example, the intermediate body 120 may be formed by alternately repeating a process of ejecting a small amount of the first material from the shaping head 110 and a process of curing the ejected small amount of the first material. In this case, the intermediate body 120 may be formed of only the main body member 122. That is, the gap 90 may not be filled with the support member 124.

In addition, instead of ejecting the first material from the shaping head 110, the intermediate body 120 may be formed by irradiating a layer formed of the first material with a laser beam and selectively curing the first material. For example, the laminate shaping may be performed for the intermediate body 120 by irradiating a material layer comprised of the ceramic fine particles with the laser beam and partially curing or sintering the material layer. In this case, the gap 90 may be filled with the support member 124, or the intermediate body 120 may be formed without filling the gap 90 with the support member 124. Therefore, the intermediate body 120 may be formed of only the main body member 122.

The insulator 80 may be formed by joining a plurality of components to each other. For example, the plurality of components partially constituting the insulator 80 may be individually formed, and thereafter, the plurality of components may be joined to each other. Each of the plurality of components may be formed by using the three-dimensional printing technique such as the laminate shaping method, or may be formed by using a general forming technique utilizing machining or a molding.

Figure 7:
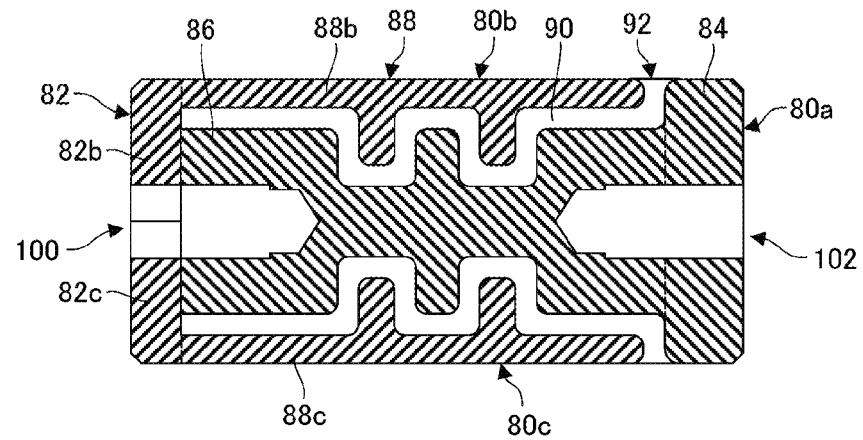
FIG. 7 is a sectional view schematically illustrating another configuration example of the insulator illustrated in FIG. 4.

FIG. 7 is a sectional view schematically illustrating another configuration example of the insulator 80 illustrated in FIG. 4. In the example of FIG. 7, the insulator 80 is configured to include a plurality of components 80*a*, 80*b*, and 80*c*. The first component 80*a* includes the second end portion 84 and the shaft portion 86. The second component 80*b* includes a first portion 82*b* of the first end portion 82 and a first portion 88*b* of the surrounding portion 88. The third component 80*c* includes a second portion 82*c* of the first end portion 82 and a second portion 88*c* of the surrounding portion 88. Each of the plurality of components 80*a* to 80*c* can be formed by any desired method, for example, may be formed by using the three-dimensional printing technique, may be formed by using a mold, or may be formed by machining.

Figure 8:
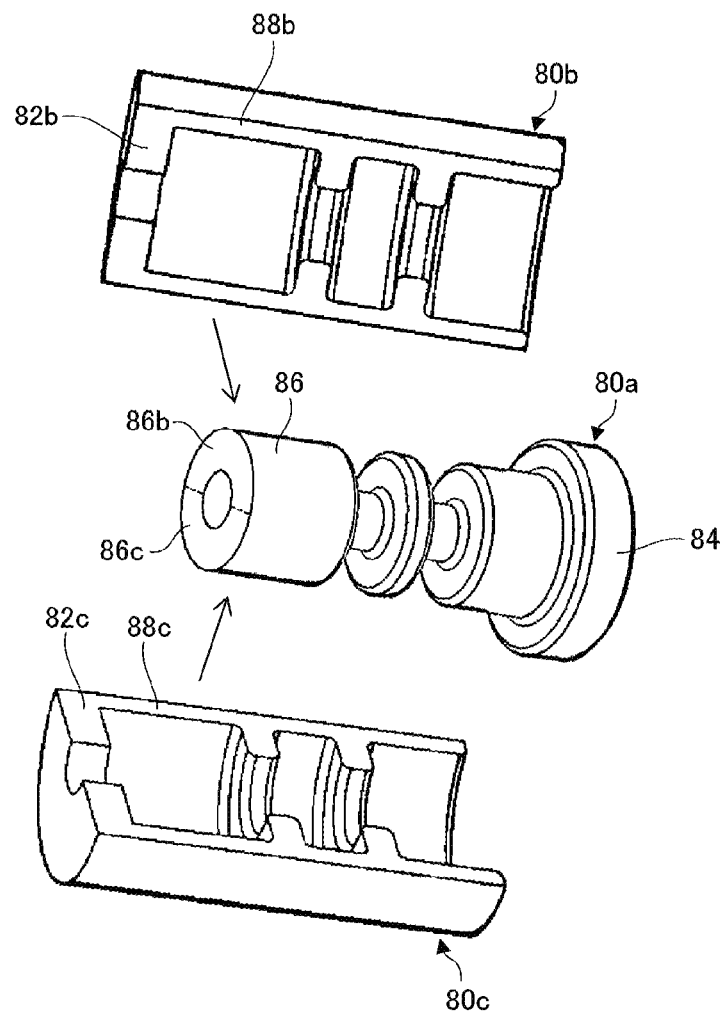
FIG. 8 is a perspective view schematically illustrating a process of joining a plurality of components in FIG. 7.

FIG. 8 is a perspective view schematically illustrating a process of joining the plurality of components 80*a* to 80*c* in FIG. 7 to each other. The second component 80*b* and the third component 80*c* are disposed around the first component 80*a*, and the plurality of components 80*a* to 80*c* are joined to each other. In this manner, the insulator 80 in FIG. 7 is manufactured. Specifically, a first tip portion 86*b* of the shaft portion 86 of the first component 80*a* is joined to the first portion 82*b* of the first end portion 82, and a second tip portion 86*c* of the shaft portion 86 of the first component 80*a* is joined to the second portion 82*c* of the first end portion 82. At the same time that the second tip portion 86*c* is joined to the second portion 82*c*, the second component 80*b* and the third component 80*c* are joined to each other so that the first end portion 82 and the surrounding portion 88 are integrated with each other.

The plurality of components 80*a* to 80*c* may be joined to each other by using an adhesive. After the plurality of components 80*a* to 80*c* are temporarily joined to each other by using the adhesive, the temporarily joined portions between the plurality of components 80*a* to 80*c* may be cured so that the plurality of components 80*a* to 80*c* are fixed to each other. For example, when the insulator 80 is formed of ceramic, the components 80*a* to 80*c* before sintering may be temporarily joined to each other by using the first material, and the insulator 80 after temporary joining may be heated and sintered so that the temporarily joined portions are cured. When the components 80*a* to 80*c* before sintering are temporarily joined to each other, the support member may be disposed in the gap 90 between the plurality of components 80*a* to 80*c*. The support member is removed before the sintering, during the sintering, or after the sintering of the temporarily joined components 80*a* to 80*c*.

When the insulator 80 is divided into the plurality of components, divided components are not limited to the examples illustrated in FIGS. 7 and 8. For example, the shaft portion 86 of the insulator 80 may be divided into the plurality of components. In a certain embodiment, the first component may have a first portion of the shaft portion 86, the second component may have a second portion of the shaft portion 86, and the third component may have a third portion of the shaft portion 86. In this case, the first component may further have the second end portion 84, the second component may further have a portion of the first end portion 82 and the surrounding portion 88, and the third component may further have the other portion of the first end portion 82 and the surrounding portion 88. In addition, the number of divisions when the insulator 80 is divided into the plurality of components is not particularly limited, and the insulator 80 may be divided into four or more components.

Figure 9:
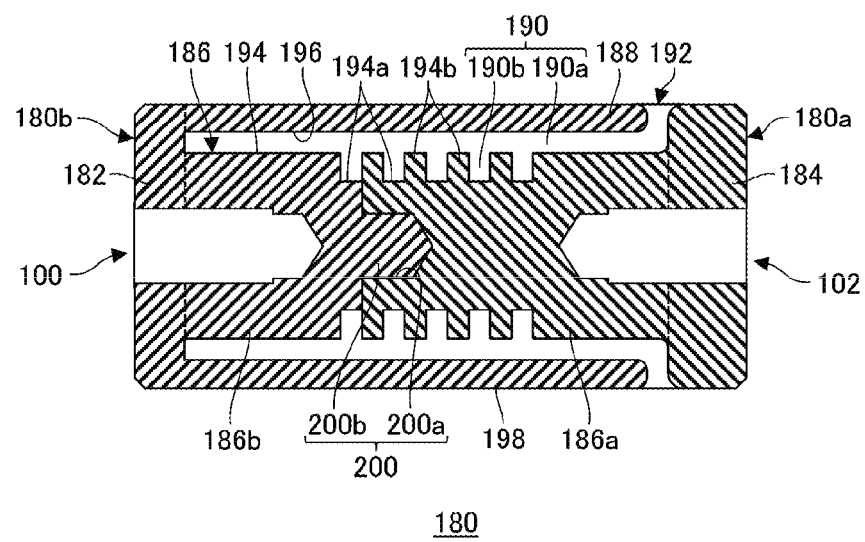
FIG. 9 is a sectional view illustrating a detailed configuration of an insulator according to a modification example.

FIG. 9 is a sectional view illustrating a detailed configuration of the insulator 180 according to a modification example. In the present modification example, the insulator 180 is configured to include a first component 180a and a second component 180b. In addition, in the present modification example, whereas an outer surface 194 of a shaft portion 186 is provided with an inner recessed portion 194a and an inner protruded portion 194b, an inner surface 196 of a surrounding portion 188 may not be provided with the unevenness. A gap 190 formed between the shaft portion 186 and the surrounding portion 188 has a first portion 190a linearly extending in the axial direction and a second portion 190b branched from the first portion 190a and extending in the radial direction.

The insulator 180 includes a first end portion 182, a second end portion 184, a shaft portion 186, and a surrounding portion 188. Each of the first end portion 182 and the second end portion 184 is configured in the same manner as the first end portion 82 and the second end portion 84 in FIG. 4. The shaft portion 186 is a columnar member extending in the axial direction from the first end portion 182 toward the second end portion 184. The outer surface 194 of the shaft portion 186 is provided with a plurality of inner recessed portions 194a and a plurality of inner protruded portions 194b. The surrounding portion 188 is a cylindrical member extending in the axial direction from the first end portion 182 toward the second end portion 184. The inner surface 196 and the outer surface 198 of the surrounding portion 188 are formed to have a cylindrical surface, and are configured to be a smooth surface having substantially no unevenness. The gap 190 is formed between the shaft portion 186 and the surrounding portion 188. An opening 192 is formed between the surrounding portion 188 and the second end portion 184. The insulator 180 has a columnar shape as a whole, and has a rotationally symmetric shape. The appearance of the insulator 180 is similar to the appearance of the insulator 80 illustrated in FIG. 5.

The first component 180a includes the second end portion 184 and the first portion 186a of the shaft portion 186. The second component 180b includes the first end portion 182, the second portion 186b of the shaft portion 186, and the surrounding portion 188. The first component 180a and the second component 180b are provided with an engagement portions 200 for connecting both of these to each other. The engagement portions 200 have an engagement recessed portion 200a provided in the first component 180a and an engagement protruded portion 200b provided in the second component 180b. The first component 180a may be provided with the engagement protruded portion, and the second component 180b may be provided with the engagement recessed portion. The engagement portions 200 may have a screw structure.

The insulator 180 can be manufactured by joining the first component 180a and the second component 180b to each other. First, each of the first component 180a and the second component 180b is formed by any desired method. Each of the first component 180a and the second component 180b may be formed by using a mold, may be formed by machining, or may be formed by using the three-dimensional printing technique. Subsequently, the engagement portions 200 of the first component 180a and the second component 180b are engaged with and joined to each other. The engagement portions 200 may be joined to each other by using an adhesive, or the engagement portions 200 may be configured not to be detachable. When the insulator 180 is formed of ceramic, the first component 180a and the second component 180b before sintering are joined to each other, and the insulator 180 after joining is heated and sintered so that the joined portions are cured and integrated with each other.

Also in the present modification example, the gap 190 of the insulator 180 is configured to have a portion which is not directly visible from the outside. Therefore, the same advantageous effects as the above-described embodiment can be achieved also in the present modification example.

In the example of FIG. 9, the unevenness is provided only on the outer surface 194 of the shaft portion 186. However, the unevenness may be formed on the inner surface 196 of the surrounding portion 188. In this case, the unevenness of the outer surface 194 of the shaft portion 186 and the unevenness of the inner surface 196 of the surrounding portion 188 may be formed not to interfere with each other so that the first component 180a can be inserted into the second component 180b. For example, the protruded portion of the inner surface 196 of the surrounding portion 188 may be disposed at a position corresponding to the protruded portion of the outer surface 194 of the shaft portion 186, and the recessed portion of the inner surface 196 of the surrounding portion 188 may be disposed at a position corresponding to the recessed portion of the outer surface 194 of the shaft portion 186. In addition, without providing the unevenness on the outer surface 194 of the shaft portion 186, the unevenness may be formed only on the inner surface 196 of the surrounding portion 188.

Figure 10:
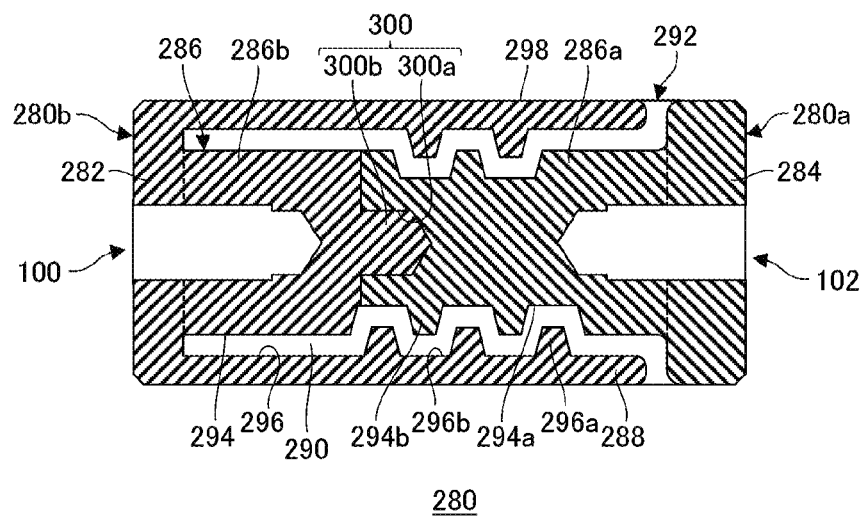
FIG. 10 is a sectional view illustrating a detailed configuration of an insulator according to another modification example.

FIG. 10 is a sectional view illustrating a detailed configuration of an insulator 280 according to another modification example. In the present modification example, the insulator 280 is configured to include a first component 280a and a second component 280b in the same manner as the above-described modification example. In the present modification example, an outer surface 294 of a shaft portion 286 is provided with an inner recessed portion 294a and an inner protruded portion 294b, and inner surface 296 of a surrounding portion 288 is provided with an outer protruded portion 296a and an outer recessed portion 296b. In order to enable the first component 280a and the second component 280b to be joined to each other, the unevenness formed on the outer surface 294 of the shaft portion 286 and the unevenness formed on the inner surface 296 of the surrounding portion 288 are configured to spirally extend.

The insulator 280 includes a first end portion 282, a second end portion 284, the shaft portion 286, and the surrounding portion 288. Each of the first end portion 282 and the second end portion 284 is configured in the same manner as the first end portion 82 and the second end portion 84 in FIG. 4. The shaft portion 286 is a columnar member extending in the axial direction from the first end portion 282 toward the second end portion 284. The inner recessed portion 294a and the inner protruded portion 294b are spirally provided on the outer surface 294 of the shaft portion 286. The surrounding portion 288 is a cylindrical member extending in the axial direction from the first end portion 282 toward the second end portion 284. The outer protruded portion 296a and the outer recessed portion 296b are spirally provided on the inner surface 296 of the surrounding portion 288. The outer protruded portion 296a is provided at a position corresponding to the inner recessed portion 294a, and the outer recessed portion 296b is provided at a position corresponding to the inner protruded portion 294b. The outer surface 298 of the surrounding portion 288 is formed to have a cylindrical surface, and is configured to be a smooth surface having substantially no unevenness. A spirally extending gap 290 is formed between the shaft portion 286 and the surrounding portion 288. An opening 292 is formed between the surrounding portion 288 and the second end portion 284. The insulator 280 has a columnar shape as a whole. The appearance of the insulator 280 is similar to the appearance of the insulator 80 illustrated in FIG. 5.

The first component 280a includes the second end portion 284 and a first portion 286a of the shaft portion 286. The second component 280b includes the first end portion 282, a second portion 286b of the shaft portion 286, and the surrounding portion 288. The first component 280a and the second component 280b are provided with engagement portions 300 for connecting both of these to each other. The engagement portions 300 have an engagement recessed portion 300a provided in the first component 280a and an engagement protruded portion 300b provided in the second component 280b. The first component 280a may be provided with the engagement protruded portion, and the second component 280b may be provided with the engagement recessed portion. The engagement portions 300 may have a screw structure. The first component 280a and the second component 280b of the present modification example can be formed in the same manner as the first component 180a and the second component 180b in FIG. 9.

Figure 11:
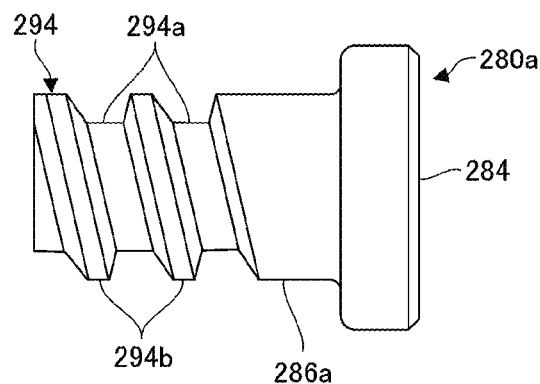
FIG. 11 is a side view illustrating an appearance of a first component in FIG. 10.

FIG. 11 is a side view illustrating an appearance of the first component 280a in FIG. 10. As illustrated, the outer surface 294 of the first portion 286a of the shaft portion 286 is provided with the inner recessed portion 294a and the inner protruded portion 294b which spirally extend. The inner surface 296 of the surrounding portion 288 of the second component 280b is provided with the outer protruded portion 296a and the outer recessed portion 296b which spirally extend to correspond to the inner recessed portion 294a and the inner protruded portion 294b. The recessed portions and the protruded portions which constitute the gap 290 of the insulator 280 are spirally formed. In this manner, the engagement portions 300 can be engaged with each other by inserting the first component 280a into the second component 280b while rotating the first component 280a. Thereafter, the insulator 280 can be manufactured by integrating the first component 280a and the second component 280b with each other in the same manner as the insulator 180 in FIG. 9.

Also in the present modification example, the gap 290 of the insulator 280 is configured to have the portion which is not directly visible from the outside. Therefore, the same advantageous effects as the above-described embodiment can be achieved also in the present modification example.

Figure 12:
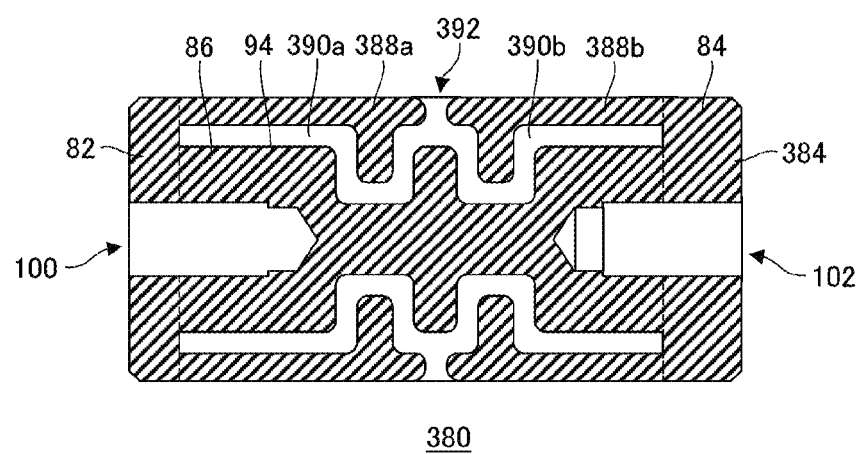
FIG. 12 is a sectional view illustrating a detailed configuration of an insulator according to still another modification example.

FIG. 12 is a sectional view illustrating a detailed configuration of an insulator 380 according to still another modification example. The insulator 380 according to the present modification example includes the first end portion 82, the second end portion 84, the shaft portion 86, a first surrounding portion 388a, and a second surrounding portion 388b. The first end portion 82, the second end portion 84, and the shaft portion 86 are configured in the same manner as the above-described embodiment. The first surrounding portion 388a is connected to the first end portion 82, and extends in the axial direction from the first end portion 82 toward the second end portion 84. The second surrounding portion 388b is connected to the second end portion 84, and extends in the axial direction from the second end portion 84 toward the first end portion 82. A first gap 390a is formed between the shaft portion 86 and the first surrounding portion 388a, and a second gap 390b is formed between the shaft portion 86 and the second surrounding portion 388b. An opening 392 is provided between the first surrounding portion 388a and the second surrounding portion 388b. The first gap 390a and the second gap 390b communicate with the outside of the insulator 380 through the opening 392. The insulator 380 may be integrally formed by using the three-dimensional printing technique, or may be formed by joining the plurality of components to each other.

Also in the present modification example, the gaps 390a and 390b of the insulator 380 are configured to have the portion which is not directly visible from the outside. Therefore, the same advantageous effects as the above-described embodiment can be achieved also in the present modification example.

In the above-described embodiment and modification examples, cases have been described where all components of each of the insulators 80, 180, 280, and 380 are formed of the same material. In another embodiment, the plurality of components constituting the insulator may be formed of different materials from each other. In still another embodiment, a joining component for joining the plurality of components to each other may be used. The joining component may be formed of material different from the material for constituting the insulator. The joining component may be formed of metal, resin, or ceramic.

In the above-described embodiment and modification examples, cases have been described where the insulating structure 74 including each of the insulators 80, 180, 280, and 380 is used for the extraction electrode of the ion generation device 12. In another embodiment, the insulating structure 74 may be used at any desired location in the ion implanter 10. For example, the insulating structure 74 may be used as a structure provided in the beam park device 24, the beam scanning unit 32, the beam parallelizing unit 34, or the angular energy filter 36 to support the electrode to which a high voltage is applied.

Hitherto, the present invention has been described with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, processing sequences can be appropriately rearranged, or various modifications such as design changes can be added to the embodiments. The embodiments having the added variations can also be included in the scope of the present invention.

It should be understood that the invention is not limited to the above-described embodiments, but may be modified into various forms on the basis of the spirit of the invention. Additionally, the modifications are included in the scope of the invention.

What is claimed is:

1. An insulating structure comprising:
   a first end portion;
   a second end portion;
   a shaft portion connecting the first end portion and the second end portion to each other;
   a surrounding portion including an inner surface facing an outer surface of the shaft portion, and extending toward the second end portion from the first end portion, and
   a pair of a recessed portion and a protruded portion protruding toward the recessed portion,
   wherein a gap between the outer surface of the shaft portion and the inner surface of the surrounding portion is configured to communicate with an outside, wherein the first end portion, the second end portion, the shaft portion, and the surrounding portion are formed of electrical insulating material, wherein the inner surface of the surrounding portion includes an inner recessed portion or an inner protruded portion, wherein the outer surface of the shaft portion includes an outer recessed portion or an outer protruded portion, and wherein the pair of the recessed portion and the protruded portion is a pair of the inner recessed portion and the outer protruded portion or a pair of the outer recessed portion and the inner protruded portion.

2. The insulating structure according to claim 1, wherein the gap is configured to have a portion that is not directly visible from the outside.

3. The insulating structure according to claim 1, wherein the pair of the recessed portion and the protruded portion extends in a circumferential direction or in a spiral shape.

4. The insulating structure according to claim 1, wherein an outer surface of the surrounding portion is a cylindrical surface.

5. The insulating structure according to claim 1, wherein the insulating structure has an opening extending in a radial direction, and the gap communicates with the outside through the opening.

6. The insulating structure according to claim 1, wherein the surrounding portion is connected to the first end portion, an opening is provided between the surrounding portion and the second end portion, and the gap communicates with the outside through the opening.

7. The insulating structure according to claim 5, wherein the opening is configured so that an opening width increases as the opening gets away from the shaft portion in the radial direction.

8. The insulating structure according to claim 5, wherein the gap is configured so that a distance between the outer surface of the shaft portion and the inner surface of the surrounding portion decreases as the gap gets away from the opening.

9. The insulating structure according to claim 1, wherein the first end portion, the second end portion, the shaft portion, and the surrounding portion are formed of same material.

10. The insulating structure according to claim 1, wherein the first end portion, the second end portion, the shaft portion, and the surrounding portion are formed of at least one of ceramic material and resin material.

11. The insulating structure according to claim 1, wherein the inner surface of the surrounding portion includes both the inner recessed portion and the inner protruded portion, wherein the outer surface of the shaft portion includes both the outer recessed portion and the outer protruded portion, and wherein insulating structure comprises both the pair of the inner recessed portion and the outer protruded portion and the pair of the outer recessed portion and the inner protruded portion.

* * * * *